United States Patent [19]

Wrathall

[11] Patent Number: 4,553,084
[45] Date of Patent: Nov. 12, 1985

[54] CURRENT SENSING CIRCUIT
[75] Inventor: Robert S. Wrathall, Tempe, Ariz.
[73] Assignee: Motorola, Inc., Schaumburg, Ill.
[21] Appl. No.: 595,764
[22] Filed: Apr. 2, 1984
[51] Int. Cl.$^4$ .............................................. G05F 3/16
[52] U.S. Cl. .................................... 323/316; 323/314; 330/257
[58] Field of Search ............... 323/312, 314, 315, 316; 330/257, 288

[56] References Cited

U.S. PATENT DOCUMENTS 3,887,863  6/1975  Brokaw ................................ 323/314
4,055,812 10/1977  Rosenthal ............................ 330/257
4,251,743  2/1981  Hareyama ........................... 323/316

OTHER PUBLICATIONS

McClellan, Andrew, "Current Source and 555 Timer Make Linear v-to-f Converter," *Electronics*, Jun. 10, 1976, pp. 108-109.

*Primary Examiner*—Peter S. Wong
*Assistant Examiner*—Anita M Ault
*Attorney, Agent, or Firm*—William E. Koch

[57] ABSTRACT

A current sensing circuit is disclosed wherein a small portion of a load current is sampled through a sensing resistor and a substantially larger portion of the load current is allowed to bypass the sensing resistor. A first high current vertical MOS transistor is coupled between the load and the ground terminal. A second vertical MOS transistor is coupled in series between the load and ground terminal. The transistors are constructed in a vertical MOS cellular construction whereby the first transistor comprises on the order of three-thousand cells and the second transistor comprises a single cell. A signal is taken across the sensing resistor and may be provided as feedback to a control means driving the first and second transistors for performing a current limiting or constant current function.

8 Claims, 2 Drawing Figures

CURRENT SENSING CIRCUIT

BACKGROUND OF THE INVENTION

1. Field of the Invention

This invention relates generally to current sensing circuits, and more particularly, to a current sensing circuit having high power vertical MOS transistors.

2. Background Art

It is often desirable to sense a large current flowing in a load in order to either control that current or to prevent it from exceeding certain bounds. For example, the output current from a power supply may be limited to prevent damage to the power control devices in that supply. It may also be desirable to control the current through a device rather than the voltage applied to it, in a constant current configuration.

One previously known technique is to insert a sense resistor into the high current path and sense the voltage generated across such a device. The voltage drop across the resistor is proportional to the current flowing through it. The disadvantages of such a method are high power dissipation and excess voltage drop across the sense resistor.

A previously known circuit, U.S. Pat. No. 4,319,181, senses the current by other means. The circuit senses current by means of sampling the current through a portion of the power device. Since the power device is monolithic, the various sections of it carry proportionate current. The sensing of the current sample is accomplished by a first bipolar transistor coupled in series with a sensing resistor between an input and output terminal. A second bipolar transistor is coupled between the input terminal and output terminal, wherein a larger portion of the load current is carried through the second transistor. Lateral collectors of the transistors are used to sense a portion of the current carried by substrate collectors which provide the output. Lateral collectors are connected to a current mirror which provides an output indication of when the output current exceeds a predetermined amount.

MOS devies can not use lateral drains in the same fashion that bipolar devices can use lateral collectors. As a result, this method can not be employed by a MOS device to sense current. In a vertical power MOS device, it is generally difficult to obtain a portion of the drain current because it is flowing vertically into the device substrate. Thus, a need exists for these devices which are generally useful for vertical MOS devices but not limited to that vertical structure.

SUMMARY OF THE INVENTION

Accordingly, it is an object of the present invention to provide an improved current sensing circuit.

Another object of the present invention is to provide a current sensing circuit for high current levels having a voltage drop across a sense resistor with only a portion of the load current flowing through it.

In carrying out the above and other objects of the present invention in one form, there is provided a current sensing circuit having an input terminal responsive to a load current, a supply voltage terminal and an output terminal. A first transistor for carrying substantially most of the load current is coupled between the input terminal and a supply voltage terminal. A second transistor for carrying the sensing current is coupled between the input terminal and a first side of a sensing resistor. The other side of the sensing resistor is coupled to the supply voltage terminal. A gate drive means is coupled to the gates of the two transistors. The output terminal is coupled to the first side of the sensing resistor and may provide an error signal as feedback to the gate drive means. The transistors comprise a cellular vertical power MOS transistor arrangement wherein the first transistor may comprise a large plurality of cells and the second transistor comprises a single cell. Therefore, the current through the first transistor may be many times larger than that of the current through the second transistor. Since the second transistor is a MOS device having a small gain, the current through the sense resistor will be quite small and the signal at the output terminal will also be small compared to the source-gate voltage.

The above and other objects, features and advantages of the present invention will be better understood from the following detailed description taken in conjunction with the accompanying drawings.

DETAILED DESCRIPTION OF THE DRAWINGS

Figure 1:
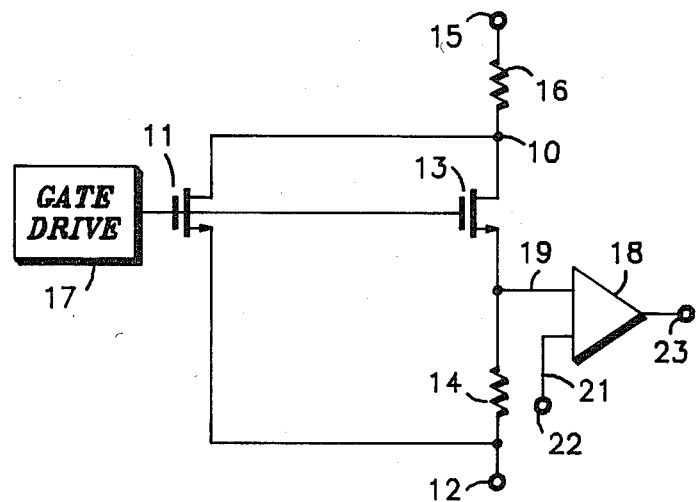
FIG. 1 illustrates in partial block diagram form one embodiment of the present invention.

Referring to FIG. 1, the current sensing circuit of the present invention includes an MOS transistor 11 having its source coupled to supply voltage terminal 12, which for example, may be ground. MOS transistor 13 has its source coupled to supply voltage terminal 12 by sense resistor 14. The drains of both transistors 11, 13 are coupled to supply voltage terminal 15 by load 16. Input mode 10 receives a load current from load 16. Gate drive 17 provides a voltage to the gates of transistors 11, 13 in a manner known to those skilled in the art.

Amplifier 18 has a first input terminal 19 connected to the source of transistor 13 and a second input terminal 21 connected to a reference voltage terminal 22. The output of amplifier 18 is connected to output terminal 23. The output signal from output terminal 23 provides an indication of the load current through load 16 exceeding a predetermined limit. The output signal from output terminal 23 may be provided as feedback to gate drive 17 for performing a current limiting or constant current function.

Transistors 11, 13 may be any type of low gain MOS device; however, preferably would comprise a vertical power structure having a substrate serving as a drain. This arrangement allows for cellular construction of the devices wherein transistor 13 may comprise, for example, a single cell, and transistor 11 may comprise a plurality of cells in parallel. For example, as many as three thousand cells or more may be used for transistor 11.

Therefore, it is seen that when a voltage is applied to voltage supply terminal 15 and a current is established through load 16, substantially all of the current will flow through transistor 11 to supply voltage terminal 12. Only a small portion of the load current will flow through transistor 13 and sense resistor 14 to supply voltage terminal 12. Since the power MOS transistor 13 is substantially a low gain device, small changes across the gate-source junction will not substantially alter the current therethrough. Furthermore, since the current through transistor 13 and sense resistor 14 is small, the voltage drop across resistor 14 is quite small and has little effect on the load current. The signal applied to input terminal 19 of amplifier 18, and therefore output terminal 23, is proportional to the voltage drop across sense resistor 14. This voltage drop is proportional to the current through transistor 13, which is also proportional to the current through transistor 11.

For the three thousand to one cellular arrangement suggested above, only about three milliamps of current will flow through transistor 13 and sense resistor 14 when a load draws ten amps. When the sense resistor has a value of thirty ohms, approximately 100 millivolts will be supplied to input terminal 19 of amplifier 18.

Each cell of the vertical power MOS structure would have a resistance of approximately 1500 ohms. Therefore, transistor 11, composed of approximately 3000 such cells in parallel would have a resistance of approximately 0.5 ohm. Resistor 14 having thirty ohms is in series with a single cell of the large power device, denoted by transistor 13.

The size of the resistor 14 is kept much smaller than the minimum resistance offered by the impedance of the source of the single cell transistor 13. Then the voltage drop across sense resistor 14 is much smaller than the total voltage drop across the source-gate terminals. In this condition, the small voltage drop across sense resistor 14 will have a negligible effect on the total current in the individual cell due to the square law relationship of current to voltage. This relationship will hold over both the linear region and saturation region of MOS operation. As a result, the total voltage drop across resistor 14 is proportional to the current in load 16.

Figure 2:
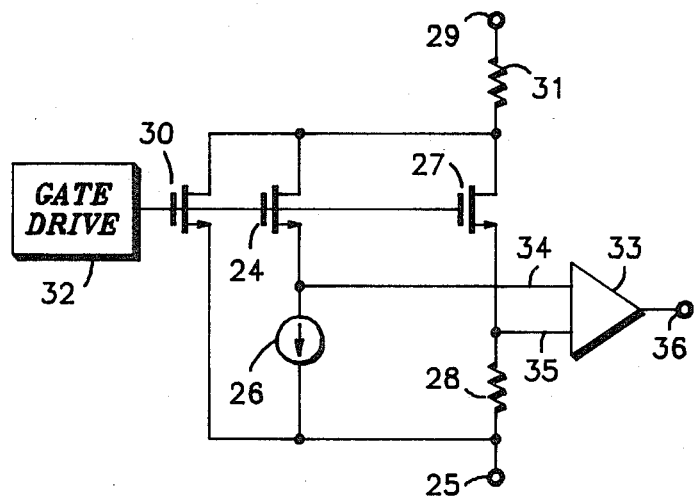
FIG. 2 illustrates in partial block diagram form another embodiment of the present invention.

Referring to FIG. 2, a second embodiment of the present invention shows a specific generation of a reference signal for use at terminal 22 in FIG. 1. This embodiment includes a power transistor 30 having its source connected to supply terminal 25, which may be ground, and an MOS transistor 24 having its source coupled to supply voltage terminal 25 by current source 26. MOS transistor 27 has its source coupled to supply voltage terminal 25 by sense resistor 28. The drains of transistors 24, 27, 30 are coupled to supply voltage terminal 29 by load 31. Gate drive 32 supplies a voltage to the gates of transistors 24, 27, 30 in a manner known to those skilled in the art. Amplifier 33 has a first input terminal 34 connected to the source of transistor 24 and a second input terminal 35 connected to the source of transistor 27. The output of amplifier 33 is connected to ouput terminal 36.

The circuit of FIG. 2 operates similar to the circuit of FIG. 1. MOS transistors 24, 27, 30 are constructed in the cellular arrangement described above with transistor 30 comprising a large number of cells and transistors 24, 27 each comprising a single cell. Therefore, substantially most of the current through load 31 will flow through transistor 30. The output of amplifier 33 is determined by the difference in voltage drops across sensing resistor 28 and current source 26. When the current through transistor 27 equals the current through current source 26, the voltage difference on amplifier 33 will be zero.

By now it should be appreciated that there has been provided an improved circuit for sensing large currents.

I claim:

1. A current sensing circuit coupled between a load having a load current passing therethrough and a supply voltage terminal, comprising:
   a first current means coupled between said load and said supply voltage terminal for carrying a first portion of said load current;
   resistive means coupled to said supply voltage terminal for providing a voltage drop;
   second current means coupled between said load and said resistive means for carrying a second portion of said load current, said first portion being substantially larger than said second portion;
   control means coupled to said first current means and said second current means for biasing said first current means and said second current means;
   output means coupled to a first node between said second current means and said resistive means for providing an output.

2. The current sensing circuit according to claim 1 wherein said first and second current means comprise MOS transistors.

3. The current sensing circuit according to claim 1 wherein said first and second current means comprise MOS transistors having a vertical construction, said first current means having a plurality of cells and said second current means having a number of cells substantially less than said first current means.

4. The current sensing circuit according to claim 1 wherein said first and second current means comprise MOS transistors havng a vertical construction, said circuit further comprising a third current means comprising an MOS transistor coupled between said load and a second node for carrying a third portion of said load current, said second node coupled to said output means and coupled to said supply voltage terminal by a current source.

5. A current sensing circuit having an input terminal for receiving a load current, a supply voltage terminal and an output terminal, comprising:
   a first transistor having current carrying electrodes coupled between said input terminal and said supply voltage terminal;
   a second transistor having a first current carrying electrode coupled to said input terminal;
   resistive means coupled between a second current carrying electrode of said second transistor and said supply voltage terminal for providing a voltage drop, wherein said second current carrying electrode is also coupled to said output terminal; and
   a drive circuit coupled to a control electrode of each of said first and second transistors.

6. The circuit according to claim 5 wherein said output terminal is coupled to said drive circuit.

7. The current sensing cricui according to claim 5 wherein said first and second transistors are MOS transistors, said first transistor having a plurality of cells and said second transistor having a number of cells substantially less than said first current means.

8. A circuit for providing a constant current to a load comprising:
   first current means coupled between said load and a supply voltage terminal for carrying a first portion of said current;
   resistive means coupled to said supply voltage terminal for providing a voltage drop;
   second current means coupled between said load and said resistive means for carrying a second portion of said current, said first portion being substantially larger than said second portion;
   control means coupled to said first and second current means for controlling the value of said first portion and said second portion; and
   drive means coupled from a node between said resistive means and said second current means to said control means and for driving said control means.

* * * * *

UNITED STATES PATENT AND TRADEMARK OFFICE
CERTIFICATE OF CORRECTION

PATENT NO. : 4,553,084

DATED : November 12, 1985

INVENTOR(S) : Robert S. Wrathall

It is certified that error appears in the above-identified patent and that said Letters Patent is hereby corrected as shown below:

Column 4, line 47, change "cricui" to --circuit--.

Signed and Sealed this

Fifteenth Day of July 1986

[SEAL]

Attest:

DONALD J. QUIGG

Attesting Officer

Commissioner of Patents and Trademarks